United States Patent
Ju et al.

(10) Patent No.: US 11,520,380 B2
(45) Date of Patent: Dec. 6, 2022

(54) ELECTRONIC DEVICE FOR CONFIRMING WHETHER SUBMERGENCE HAS OCCURRED BY USING SUBMERGENCE SENSING CIRCUIT, AND OPERATING METHOD OF ELECTRONIC DEVICE

(71) Applicant: Samsung Electronics Co., Ltd., Gyeonggi-do (KR)

(72) Inventors: Wanjae Ju, Gyeonggi-do (KR); Kiyeong Jeong, Gyeonggi-do (KR); Hyoseok Na, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 117 days.

(21) Appl. No.: 16/965,048

(22) PCT Filed: Jan. 31, 2019

(86) PCT No.: PCT/KR2019/001336
§ 371 (c)(1),
(2) Date: Jul. 27, 2020

(87) PCT Pub. No.: WO2019/151791
PCT Pub. Date: Aug. 8, 2019

(65) Prior Publication Data
US 2020/0356144 A1 Nov. 12, 2020

(30) Foreign Application Priority Data
Jan. 31, 2018 (KR) .......................... 10-2018-0011849

(51) Int. Cl.
*G06F 1/16* (2006.01)
*G06F 11/30* (2006.01)
(Continued)

(52) U.S. Cl.
CPC ........ *G06F 1/1656* (2013.01); *G01F 23/0007* (2013.01); *G06F 1/163* (2013.01);
(Continued)

(58) Field of Classification Search
CPC ............... G06F 1/1656; G06F 11/3058; G06F 11/3013; G06F 1/1626; G06F 1/163;
(Continued)

(56) References Cited

U.S. PATENT DOCUMENTS 8,990,030 B2 3/2015 Baek
9,371,032 B2 6/2016 Veerasamy
(Continued)

FOREIGN PATENT DOCUMENTS

JP 4272899 * 6/2009 ............... H04M 1/00
JP 4272899 B2 6/2009
(Continued)

OTHER PUBLICATIONS

Korean Office Action dated Oct. 11, 2022.

*Primary Examiner* — Terrell S Johnson
(74) *Attorney, Agent, or Firm* — Cha & Reiter, LLC

(57) ABSTRACT

Disclosed in various embodiments are an electronic device, the electronic device comprising: a power control circuit for controlling power supplied to at least one component of the electronic device; at least one submergence recognition circuit including a first pole connected to at least one port of the power control circuit, and a second pole connected to a ground; a processor electrically connected to the power control circuit; and a memory electrically connected to the processor, wherein the memory can be configured, during execution thereof, to store instructions for allowing the processor to: control the power control circuit such that power is supplied to the submergence recognition circuit; sense a current flowing from the submergence recognition
(Continued)

circuit to the power control circuit; and determine, on the basis of the sensing result of the current, whether an area in which the submergence recognition circuit is arranged has been submerged.

14 Claims, 18 Drawing Sheets

(51) Int. Cl.
*G01F 23/00* (2022.01)
*G01F 23/24* (2006.01)
*G08B 21/20* (2006.01)
*G01R 19/165* (2006.01)

(52) U.S. Cl.
CPC .......... *G06F 1/1626* (2013.01); *G06F 1/1658* (2013.01); *G06F 11/3058* (2013.01); *G01F 23/241* (2013.01); *G01R 19/165* (2013.01); *G06F 11/3013* (2013.01); *G08B 21/20* (2013.01)

(58) Field of Classification Search
CPC .. G06F 1/1658; G06F 23/241; G06F 23/0007; G01F 23/241; G01F 23/0007; G01F 23/28; G08B 21/20; G01R 19/165
See application file for complete search history.

(56) References Cited

U.S. PATENT DOCUMENTS

| | | | |
|---|---|---|---|
| 2006/0032761 A1* | 2/2006 | Oguri | G01N 27/121 204/421 |
| 2014/0307356 A1 | 10/2014 | Hong et al. | |
| 2014/0327991 A1 | 11/2014 | Chung | |
| 2016/0004283 A1 | 1/2016 | Ganguly | |
| 2016/0342143 A1 | 11/2016 | Park et al. | |
| 2017/0102762 A1 | 4/2017 | Hong et al. | |

FOREIGN PATENT DOCUMENTS

| | | |
|---|---|---|
| KR | 10-2013-0031763 A | 3/2013 |
| KR | 10-2014-0123802 A | 10/2014 |
| KR | 10-2014-0130954 A | 11/2014 |
| KR | 10-2016-0135529 A | 11/2016 |
| KR | 10-2017-0036477 A | 4/2017 |
| KR | 10-2017-0041473 A | 4/2017 |

* cited by examiner

ELECTRONIC DEVICE FOR CONFIRMING WHETHER SUBMERGENCE HAS OCCURRED BY USING SUBMERGENCE SENSING CIRCUIT, AND OPERATING METHOD OF ELECTRONIC DEVICE

CROSS REFERENCE TO RELATED APPLICATIONS

This application is a National Phase Entry of PCT International Application No. PCT/KR2019/001336, which was filed on Jan. 31, 2019, and claims a priority to Korean Patent Application No. 10-2018-0011849, which was filed on Jan. 31, 2018, the contents of which are incorporated herein by reference.

TECHNICAL FIELD

Various embodiments of the disclosure relate to an electronic device which confirms whether the electronic device has been submerged using a submergence sensing circuit, and a method for operating the same.

BACKGROUND ART

Various electronic devices, such as smart phones, tablet PCs, portable multimedia players (PMPs), personal digital assistants (PDAs), laptop personal computers (PCs), and wearable devices have been popularized.

Various electronic devices receive power from a battery and operate components inside the electronic device using the supplied power.

The components inside the electronic device operate electrically. When a conductive liquid is introduced into the electronic device, a circuit board and the components inside the electronic device may be damaged due to an overcurrent phenomenon caused by the introduced conductive liquid. Damage of the circuit board and the components inside the electronic device may cause a malfunction of the electronic device.

Repair costs due to trouble of the electronic device, caused by the introduction of the conductive liquid are generally charged to a user of the electronic device, not a manufacturer of the electronic device. To this end, a manufacturer of an electronic device may attach a submergence label to an area into which a conductive liquid is easily introduced and may charge a user for repair costs due to trouble of the electronic device in the case in which the submergence label is discolored.

DISCLOSURE OF INVENTION

Technical Problem

Meanwhile, the submergence label has great spatial constraints because the size of the submergence label is too large to be attached to a circuit board on which a component of an electronic device is mounted. Therefore, the submergence label may be limitedly attached on an area into which a conductive liquid is easily introduced. This may cause difficulties in determining defects of the electronic device when a conductive liquid is introduced into an area on which the submergence label is not attached.

Solution to Problem

An electronic device according to various embodiments of the disclosure includes: a power control circuit configured to control a power supplied to at least one component of the electronic device; at least one submergence recognition circuit including a first pole connected to at least one port of the power control circuit and a second pole connected to a ground; a processor electrically connected to the power control circuit; and a memory electrically connected to the processor, wherein the memory may be configured, when executed, to store instructions for allowing the processor to: control the power control circuit such that power is supplied to the submergence recognition circuit; sense a current flowing from the submergence recognition circuit to the power control circuit; and determine whether an area in which the submergence recognition circuit is disposed has been submerged, based on the sensing result of the current. A method for operating an electronic device according to various embodiments of the disclosure includes: controlling, by a processor, a power control circuit such that power is supplied to a submergence recognition circuit including a first pole connected to at least one port of the power control circuit configured to control power supplied to at least one component of the electronic device, and a second pole connected to a ground; confirming, by the processor, whether an electrical signal is transmitted from the submersion recognition circuit to the power control circuit; and determining whether an area in which the submergence recognition circuit is disposed has been submerged, based on whether the electrical signal is transmitted.

Advantageous Effects of Invention

According to various embodiments of the disclosure, an electronic device configured to confirm whether the submergence has occurred using a submergence sensing circuit and a method for operating an electronic device can detect a conductive liquid introduced into the electronic device using a submergence sensing circuit that is smaller than a submergence label, allows easy determination of an internal circuit damage caused by the introduction of the conductive liquid, by the naked eye, and enables overcoming of structural constraints and cost losses which are associated with the attachment of the submergence label.

According to various embodiments of the disclosure, an electronic device configured to confirm whether the submergence has occurred using a submergence sensing circuit and a method for operating an electronic device can determine a submerged submergence sensing circuit, using a plurality of submergence sensing circuits, among the submergence sensing circuits, and thus can identify a location of a submerged portion.

According to various embodiments of the disclosure, an electronic device configured to confirm whether the submergence has occurred using a submergence sensing circuit and a method for operating an electronic device can confirm that a conductive liquid has been introduced into the electronic device, in real time, and simply identify the reason of malfunction of the electronic device, caused by the submergence, by notifying an external device of the introduction of the conductive liquid, thereby reducing the cost due to repair of the electronic device.

MODE FOR THE INVENTION

Figure 1:
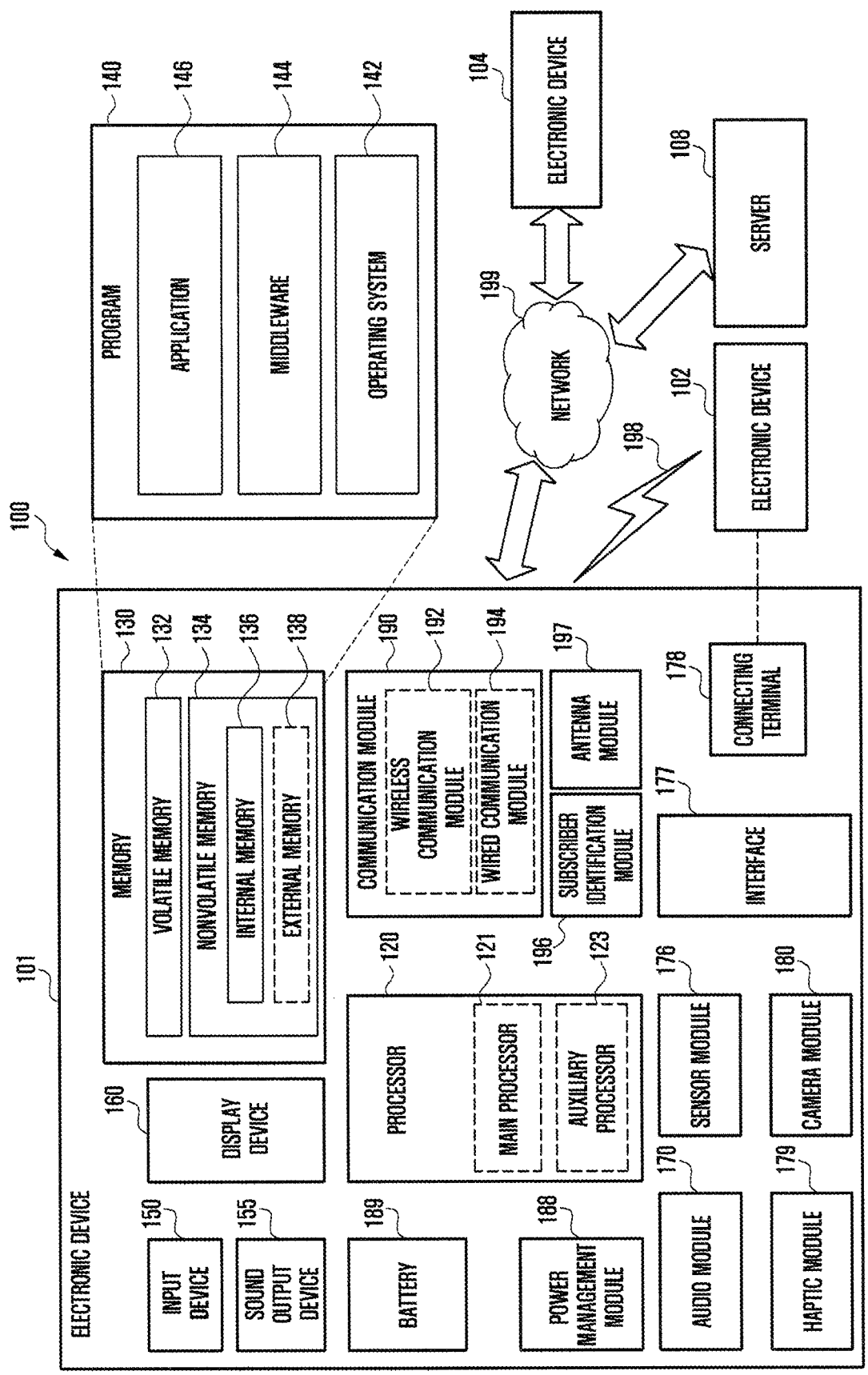
FIG. 1 is a block diagram of an electronic device according to various embodiments of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
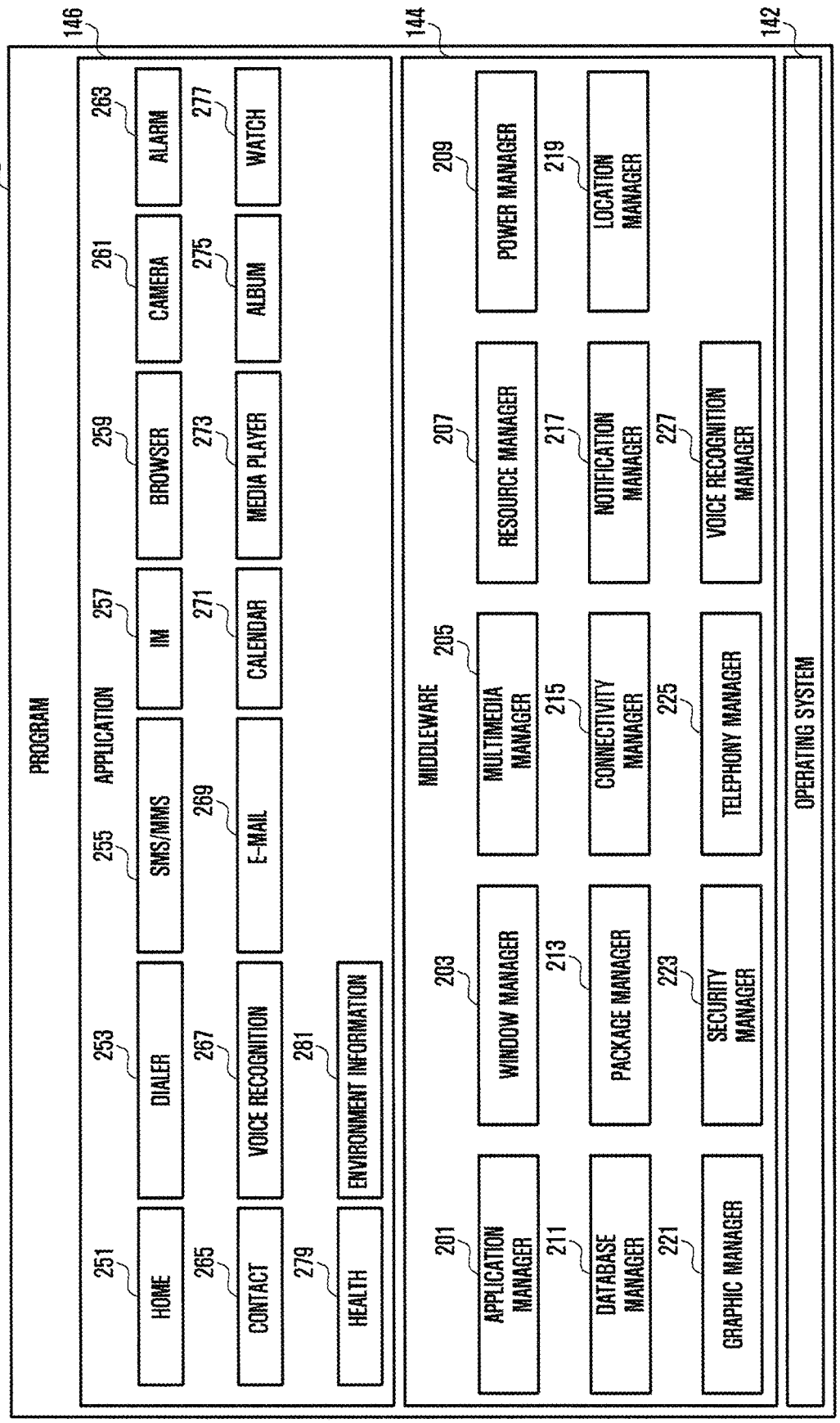
FIG. 2 is a block diagram illustrating a program available in an electronic device according to various embodiments of the disclosure.

FIG. 2 is a block diagram 200 illustrating the program 140 according to various embodiments. According to an embodiment, the program 140 may include an operating system (OS) 142 to control one or more resources of the electronic device 101, middleware 144, or an application 146 executable in the OS 142. The OS 142 may include, for example, Android™, iOS™, Windows™, Symbian™, Tizen™, or Bada™. At least part of the program 140, for example, may be pre-loaded on the electronic device 101 during manufacture, or may be downloaded from or updated by an external electronic device (e.g., the electronic device 102 or 104, or the server 108) during use by a user.

The OS 142 may control management (e.g., allocating or deallocation) of one or more system resources (e.g., process, memory, or power source) of the electronic device 101. The OS 142, additionally or alternatively, may include one or more driver programs to drive other hardware devices of the electronic device 101, for example, the input device 150, the sound output device 155, the display device 160, the audio module 170, the sensor module 176, the interface 177, the haptic module 179, the camera module 180, the power management module 188, the battery 189, the communication module 190, the subscriber identification module 196, or the antenna module 197.

The middleware 144 may provide various functions to the application 146 such that a function or information provided from one or more resources of the electronic device 101 may be used by the application 146. The middleware 144 may include, for example, an application manager 201, a window manager 203, a multimedia manager 205, a resource manager 207, a power manager 209, a database manager 211, a package manager 213, a connectivity manager 215, a notification manager 217, a location manager 219, a graphic manager 221, a security manager 223, a telephony manager 225, or a voice recognition manager 227.

The application manager 201, for example, may manage the life cycle of the application 146. The window manager 203, for example, may manage one or more graphical user interface (GUI) resources that are used on a screen. The multimedia manager 205, for example, may identify one or more formats to be used to play media files, and may encode or decode a corresponding one of the media files using a codec appropriate for a corresponding format selected from the one or more formats. The resource manager 207, for example, may manage the source code of the application 146 or a memory space of the memory 130. The power manager 209, for example, may manage the capacity, temperature, or power of the battery 189, and determine or provide related information to be used for the operation of the electronic device 101 based at least in part on corresponding information of the capacity, temperature, or power of the battery 189. According to an embodiment, the power manager 209 may interwork with a basic input/output system (BIOS) (not shown) of the electronic device 101.

The database manager 211, for example, may generate, search, or change a database to be used by the application 146. The package manager 213, for example, may manage installation or update of an application that is distributed in the form of a package file. The connectivity manager 215, for example, may manage a wireless connection or a direct connection between the electronic device 101 and the external electronic device. The notification manager 217, for example, may provide a function to notify a user of an occurrence of a specified event (e.g., an incoming call, message, or alert). The location manager 219, for example, may manage locational information on the electronic device 101. The graphic manager 221, for example, may manage one or more graphic effects to be offered to a user or a user interface related to the one or more graphic effects.

The security manager 223, for example, may provide system security or user authentication. The telephony manager 225, for example, may manage a voice call function or a video call function provided by the electronic device 101. The voice recognition manager 227, for example, may transmit a user's voice data to the server 108, and receive, from the server 108, a command corresponding to a function to be executed on the electronic device 101 based at least in part on the voice data, or text data converted based at least in part on the voice data. According to an embodiment, the middleware 244 may dynamically delete some existing components or add new components. According to an embodiment, at least part of the middleware 144 may be included as part of the OS 142 or may be implemented as another software separate from the OS 142.

The application 146 may include, for example, a home 251, dialer 253, short message service (SMS)/multimedia messaging service (MMS) 255, instant message (IM) 257, browser 259, camera 261, alarm 263, contact 265, voice recognition 267, email 269, calendar 271, media player 273, album 275, watch 277, health 279 (e.g., for measuring the degree of workout or biometric information, such as blood sugar), or environmental information 281 (e.g., for measuring air pressure, humidity, or temperature information) application. According to an embodiment, the application 146 may further include an information exchanging application (not shown) that is capable of supporting information exchange between the electronic device 101 and the external electronic device. The information exchange application, for example, may include a notification relay application adapted to transfer designated information (e.g., a call, message, or alert) to the external electronic device or a device management application adapted to manage the external electronic device. The notification relay application may transfer notification information corresponding to an occurrence of a specified event (e.g., receipt of an email) at another application (e.g., the email application 269) of the electronic device 101 to the external electronic device. Additionally or alternatively, the notification relay application may receive notification information from the external electronic device and provide the notification information to a user of the electronic device 101.

The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 3:
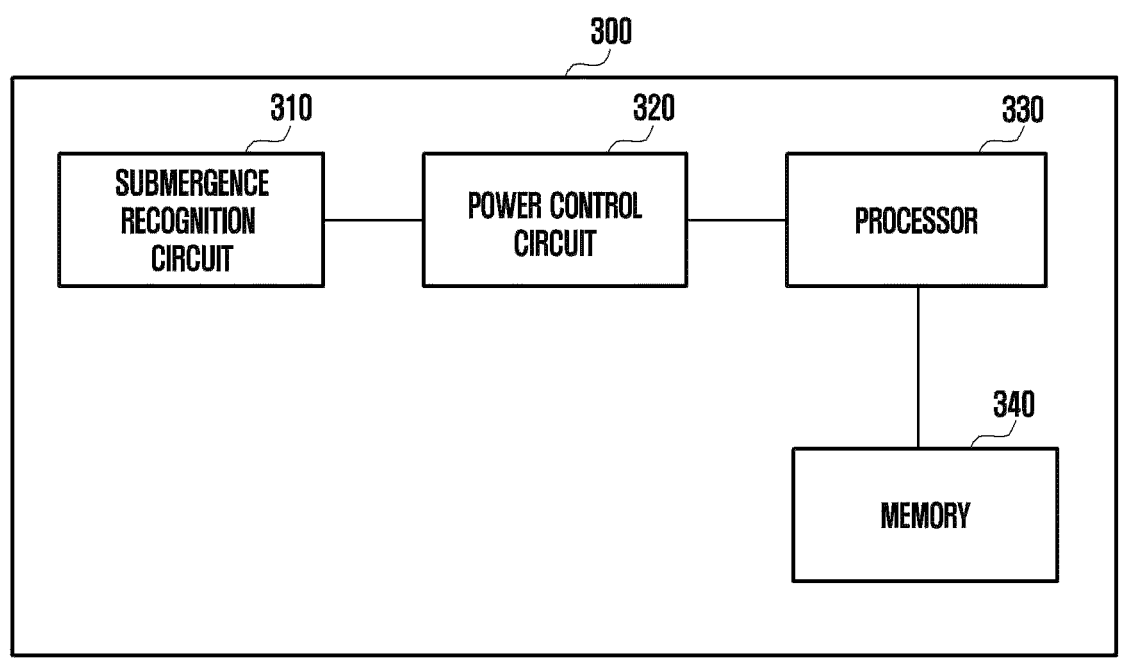
FIG. 3 is a block diagram of an electronic device according to various embodiments of the disclosure.

FIG. 3 is a block diagram of an electronic device according to various embodiments of the disclosure.

Referring to FIG. 3, an electronic device according to various embodiments of the disclosure may include a submergence recognition circuit 310, a power control circuit 320, a processor 330, and a memory 340.

The power control circuit 320 (e.g., the power management module 188 of FIG. 1) may manage power supplied to the electronic device 101. According to various embodiments of the disclosure, the power control circuit 320 may supply power supplied from a battery (e.g., the battery 189 of FIG. 1) included in the electronic device 101 to various components connected to the power control circuit 320.

According to various embodiments of the disclosure, the power control circuit 320 may supply power to the submergence recognition circuit 310 electrically connected to the power control circuit 320. The period during which the power control circuit 320 supplies power to the submersion recognition circuit 310 may be a designated period.

According to various embodiments of the disclosure, the power control circuit 320 may supply power to the submergence recognition circuit 310, based on the control of the processor 330.

According to various embodiments of the disclosure, the submergence recognition circuit 310 may include a first pole connected to at least one port of the power control circuit 320 and a second pole connected to a ground.

The first pole and the second pole may not be electrically connected to each other before the submergence recognition circuit 310 is exposed to a conductive liquid (e.g., may refer to various liquids through which electricity may flow, such as water). In the case that the submergence recognition circuit 310 is exposed to a conductive liquid, the first pole and the second pole may be electrically connected to each other. The case in which the submergence recognition circuit 310 is exposed to a conductive liquid may occur according to various situations. When various situations in which an electronic device (e.g., the electronic device 101 of FIG. 1) comes into contact with a conductive liquid occur, the conductive liquid may penetrate inside the electronic device 101. As the conductive liquid penetrates inside the electronic device 101, the submergence recognition circuit 310 may be exposed to the conductive liquid.

According to various embodiments of the disclosure, the first pole and the second pole may not be electrically connected to each other in a state in which the submergence recognition circuit 310 is not exposed to a conductive liquid or the like. That is, when power is supplied from the power control circuit 320 to the submergence recognition circuit 310, a current may not flow in the submergence recognition circuit 310. A current may not be sensed in at least one port connected to the submergence recognition circuit 310.

According to various embodiments of the disclosure, the first pole and the second pole may be electrically connected to each other in a state in which the submergence recognition circuit 310 is exposed to a conductive liquid or the like. That is, when power is supplied from the power control circuit 320 to the submergence recognition circuit 310, a current flowing from the first pole to the second pole may be generated by the power supplied from the submergence recognition circuit 310. A current flowing from the first pole toward the second pole may be sensed in at least one port connected to the submergence recognition circuit 310.

According to various embodiments of the disclosure, the processor 320 may determine whether an area in which the submergence recognition circuit 310 is disposed has been submerged, based on whether a current from the submergence recognition circuit 310 to the power control circuit 320 is sensed.

The memory 340 may temporarily or non-temporarily store various instructions performed by the processor 330. According to various embodiments of the disclosure, the memory 340 may store: an instruction for allowing the processor 330 to control the power control circuit 320 such that power is supplied to the submergence recognition circuit 310; an instruction for allowing the processor 330 to sense whether a current flows from the submergence recognition circuit 310 to the power control circuit 320; and an instruction for allowing determination of whether an area in which the submergence recognition circuit 310 is disposed has been submerged, based on the result of sensing whether the current flows.

According to various embodiments of the disclosure, when a current from the submergence control circuit 310 to the power control circuit 320 is sensed, the processor 320 may control the power control circuit 320 such that the magnitude of the sensed current is confirmed.

According to various embodiments of the disclosure, an analog to digital converter (ADC) connected to a port to which the submergence recognition circuit 310 is connected may be provided inside the power control circuit 320. The ADC may convert the magnitude of the current measured at the port to which the submergence recognition circuit 310 is connected into a digital signal. The processor 330 may confirm the magnitude of the current using the converted signal. When the magnitude of the current exceeds a specified value (or equal to or greater than a specified value), the processor 330 may determine that the area in which the submergence recognition circuit 310 is disposed has been submerged.

Referring to FIG. 3, the power control circuit 320 is illustrated as being connectable to one submergence recognition circuit 320 but may be connected to a plurality of submergence recognition circuits 320 in various embodiments of the disclosure. Various embodiments in which the submergence recognition circuit 320 is connected to the power control circuit 320 will be described later with reference to FIGS. 5 to 9.

According to various embodiments of the disclosure, the processor 330 may output a message, in various forms (e.g., sound, display, and vibration), indicating that an electronic device 300 has been submerged, in response to a determination that an area in which the submergence recognition circuit 310 is disposed has been submerged. Furthermore, the processor 330 may control the power control circuit 320 such that power supplied to a component disposed near the area in which the submergence recognition circuit 310 is disposed is cut off, in response to a determination that the area in which the submergence recognition circuit 310 is disposed has been submerged.

According to various embodiments of the disclosure, the processor 330 may transmit data notifying an external device that the area in which the submergence recognition circuit 310 is disposed has been submerged, in response to a determination that the area in which the submergence recognition circuit 310 is disposed has been submerged. The external device may be a separate server operated by a manufacturer of the electronic device 300, or the like. The manufacturer of the electronic device 300 may use data indicating that the electronic device 300 has been submerged to utilize the data for an after-sales service (AS) of the electronic device 300.

Figure 4A:
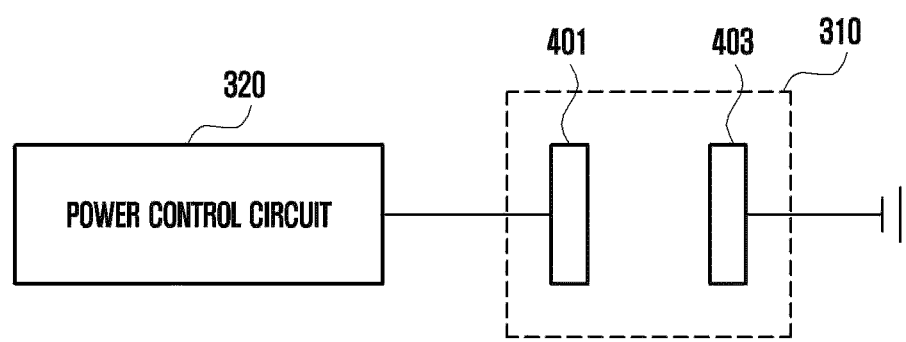
FIGS. 4A, 4B, and 4C are diagrams of a submergence recognition circuit according to various embodiments of the disclosure.
Figure 4B:
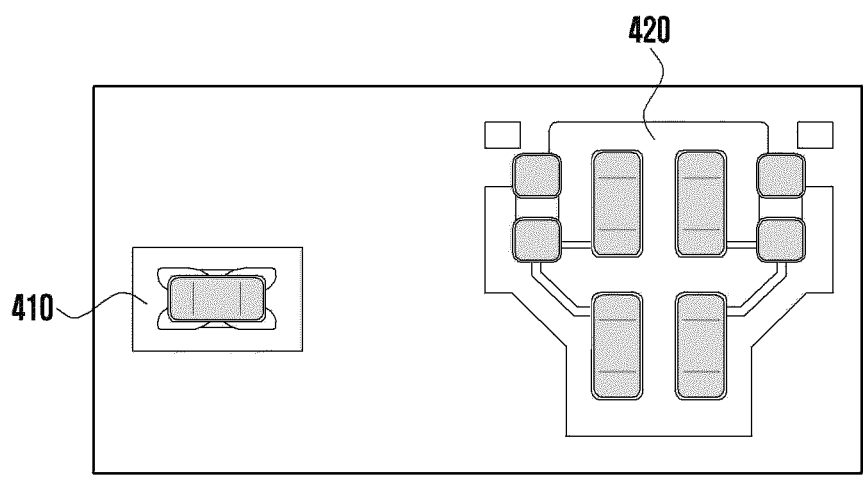
Figure 4C:
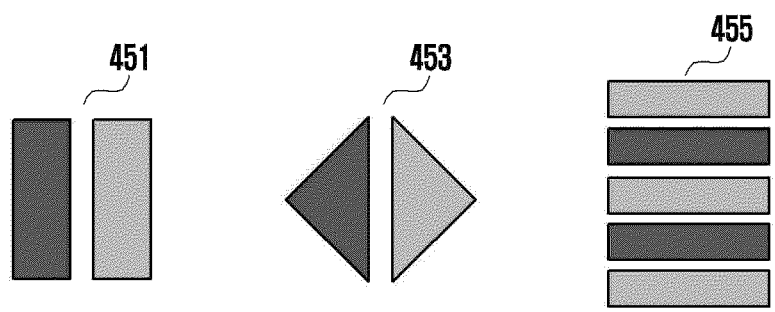
Figure 4C:
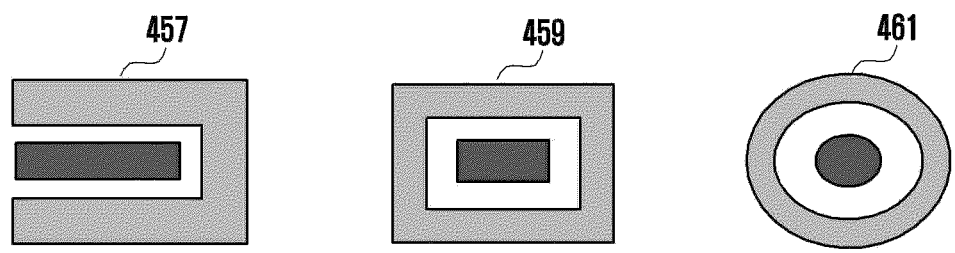
Figure 4C:
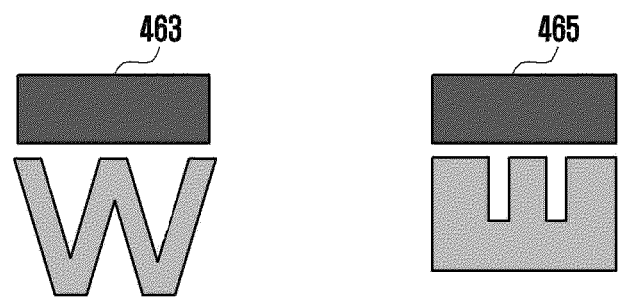

FIGS. 4A, 4B and 4C are diagrams of a submergence recognition circuit according to various embodiments of the disclosure.

Referring to 4A, an embodiment of the submergence recognition circuit 310 is illustrated. The submergence recognition circuit 310 may include a first pole 401 connected to at least one port included in a power control circuit (e.g., the power control circuit 320 of FIG. 3) and a second pole 403 connected to a ground.

According to various embodiments of the disclosure, the first pole 401 and the second pole 403 may be in an electrically unconnected state. When the first pole 401 and the second pole 403 are not electrically connected to each other, a voltage measured at the first pole 401 and a voltage measured at the second pole 403 may be different from each other. For example, the voltage measured at the first pole 401 may be the same as or similar to a voltage of the power supplied from the power control circuit 320 to the submergence recognition circuit 310. A voltage measured at the second pole 401 may be a ground voltage (0V) or a voltage similar to the ground voltage.

When the submergence recognition circuit 310 is exposed to a conductive liquid, the first pole 401 and the second pole 403 may be electrically connected to each other. For example, a conductive liquid may be positioned between the first pole 401 and the second pole 403 to electrically connect the first pole 401 and the second pole 403. In another example, the conductive liquid may cause corrosion between the first pole 401 and the second pole 403, and the first pole 401 and the second pole 403 may be electrically connected due to the corrosion.

FIG. 4B illustrates an embodiment in which the submergence recognition circuit 310 is disposed on a circuit board (e.g., PCB, FPCB, etc.) on which components of an electronic device (e.g., the electronic device 101 of FIG. 1) are arranged.

Referring to FIG. 4B, the submergence recognition circuits 410 and 420 having various shapes may be arranged on a circuit board. The submergence recognition circuits 410 and 420 may be arranged at various locations on the circuit board. According to various embodiments of the disclosure, each of the submergence recognition circuits 410 and 420 may be arranged at a location which is easily exposed to a conductive liquid (e.g., which may refer to a space between a camera and a housing, a space between a camera flash and the housing, a space between various buttons (a power button, a volume-up button, a volume-down button, and a multi-purpose button (which may refer to various buttons, such as an execution button of a voice recognition applications)) and the housing, and a location close to a connector connectable to an external device using various schemes (e.g., USB)). There is no limitation on the location in which the submergence recognition circuit 410 and 420 may be arranged. A specific example for arranging the submergence recognition circuits 410 and 420 will be described in FIGS. 10 to 12.

According to various embodiments of the disclosure, when the submergence recognition circuits 410 and 420 are exposed to a conductive liquid and a predetermined time elapses, corrosion may occur.

According to various embodiments of the disclosure, a first pole and a second pole included in each of the submergence recognition circuits 410 and 420 that are not exposed to the conductive liquid may not be electrically connected to each other. In this case, a current may not be sensed in at least one port of the power control circuit 320 connected to the submergence recognition circuits 410 and 420. This is because the state in which the first pole and the second pole are not electrically connected to each other means an open state.

According to various embodiments of the disclosure, the processor 330 may determine that areas in which the submergence recognition circuits 410 and 420 are arranged have not been submerged, in response to no current being sensed in the at least one port of the power control circuit 320 connected to the submergence recognition circuits 410 and 420.

According to various embodiments of the disclosure, the first pole and the second pole included in each of the submergence recognition circuits 430 and 440 that are exposed to a conductive liquid may be electrically connected to each other. In this case, due to the electrical connection between the first pole and the second pole, the submergence recognition circuits 430 and 440 are in a short-circuited state in which the circuits are connected to the ground. Therefore, electric current may be sensed in at least one port of the power control circuit 320 connected to the submergence recognition circuits 430 and 440.

According to various embodiments of the disclosure, the processor 330 may determine that the areas in which the submergence recognition circuits 430 and 440 are arranged have been submerged, in response to the current being sensed in the at least one port of the power control circuit 320 connected to the submergence recognition circuits 430 and 440.

FIG. 4C illustrates various embodiments of a submergence recognition circuit according to various embodiments of the disclosure.

Referring to FIG. 4C a submergence recognition circuit may be implemented in various patterns in which a first pole and a second pole are not electrically connected to each other. For example, the submergence recognition circuit may be implemented in various patterns, such as a square 451, a rhombus 453, or a rectangle 455. For another example, the submergence recognition circuit may be implemented in various patterns having a form 457 in which the first pole encloses at least a portion of the second pole or forms 459 and 461 in which the first pole encloses the second pole. For another example, the submergence recognition circuit may be implemented in character patterns 463 and 465 in which at least one of the first pole and second pole represents a specific character (e.g., alphabet shape, number shape, etc.).

FIGS. 5, 6, 7, 8, and 9 illustrate embodiments of a connection between a submersion recognition circuit and a power control circuit in an electronic device according to various embodiments of the disclosure.

Figure 5:
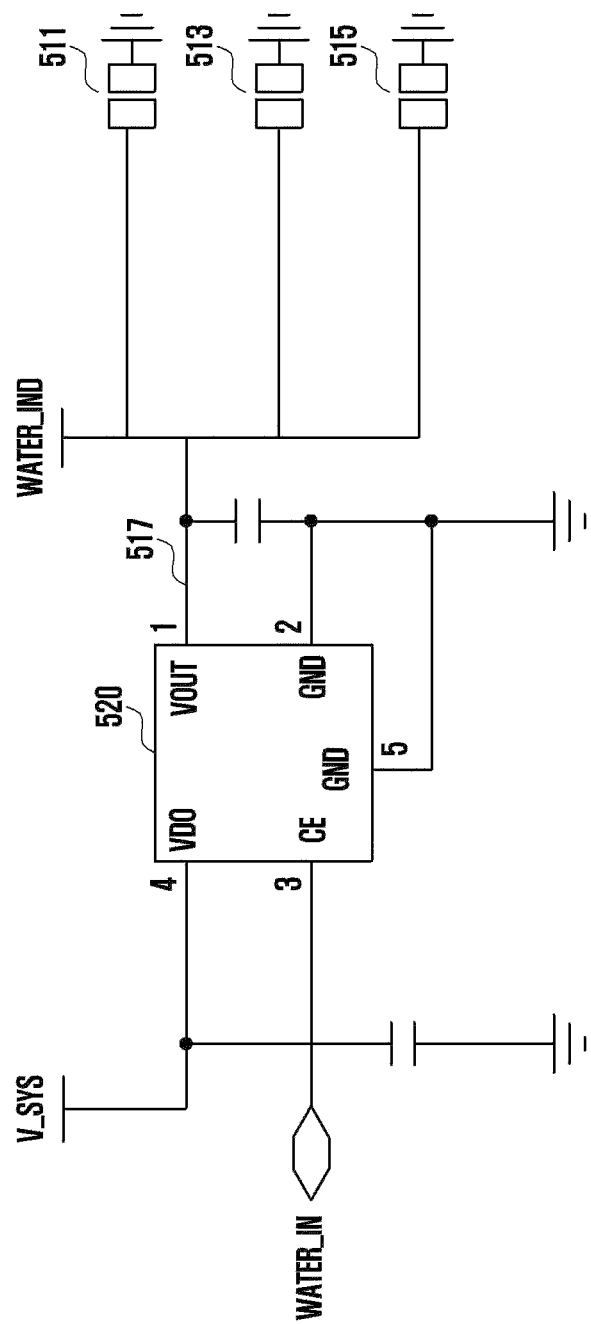
FIGS. 5, 6, 7, 8, and 9 illustrate embodiments of a connection between a submersion recognition circuit and a power control circuit in an electronic device according to various embodiments of the disclosure.

FIG. 5 illustrates an embodiment in which a plurality of submergence recognition circuits 511, 513, and 515 are connected to a port 517 included in a power control circuit 520.

According to various embodiments of the disclosure, the power control circuit 520 may be implemented as a low-drop out linear regulator (LDO), a buck converter, or a DC-DC converter, but is not limited thereto.

According to various embodiments of the disclosure, at least one submergence recognition circuit (e.g., 511) of the plurality of submergence recognition circuits 511, 513, and 515 may be exposed to a conductive liquid. A first pole and a second pole included in the submergence recognition circuit 511 may be electrically connected to each other by the conductive liquid.

According to various embodiments of the disclosure, a processor (e.g., the processor 330 of FIG. 3) may control the power control circuit 520 such that power is supplied to the port 517 connected to the submergence recognition circuits 511, 513, and 515. The power control circuit 520 may supply power to the port 517 connected to the submergence recognition circuits 511, 513, and 515, based on the control of the processor 330.

Under the assumption that at least one submergence recognition circuit (e.g., 511) of the plurality of submergence recognition circuits 511, 513, and 515 is exposed to a conductive liquid and thus the first pole and the second pole of the submergence recognition circuit 511 are electrically connected to each other, a current may flow in the submergence recognition circuit 511 in response to power supplied by the power control circuit 520 to the port 517. The power control circuit 520 may sense the current flowing in the submergence recognition circuit 511 and may transmit, to the processor 330, data indicating that a current flows in the port 517.

According to various embodiments of the disclosure, the processor 330 may determine that areas in which the submergence recognition circuits 511, 513, and 515 are arranged have been submerged, based on the sensing result of the current flow.

Figure 6:
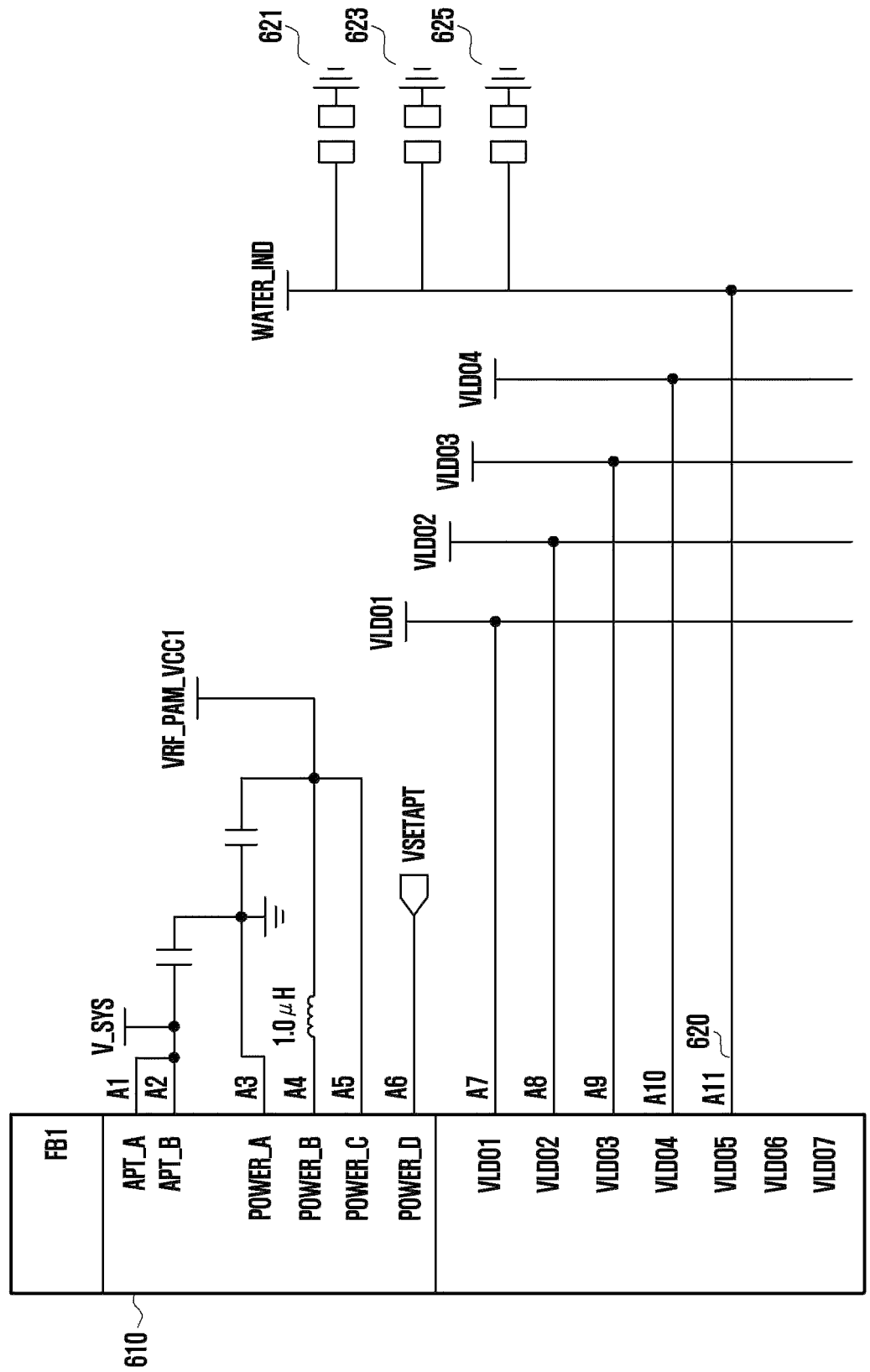

FIG. 6 illustrates an embodiment in which a plurality of submergence recognition circuits 621, 623, and 625 are connected to at least one port 620 included in the power control circuit 610.

According to various embodiments of the disclosure, the power control circuit 610 may be implemented as a power management integrated circuit (PMIC), but is not limited thereto.

According to various embodiments of the disclosure, at least one submergence recognition circuit (e.g., 621) of the plurality of submergence recognition circuits 621, 623, and 625 may be exposed to a conductive liquid. A first pole and a second pole included in the submergence recognition circuit 621 may be electrically connected to each other by the conductive liquid.

Under the assumption that at least one submergence recognition circuit (e.g., 621) of the plurality of submergence recognition circuits 621, 623, and 625 is exposed to a conductive liquid and thus the first pole and the second pole of the submergence recognition circuit 621 are electrically connected to each other, a current may flow in the submergence recognition circuit 621 in response to power supplied by the power control circuit 610 to the port 620. The power control circuit 610 may sense the current flowing in the port 517 and may transmit, to the processor 330, data indicating that a current flows in the port 517. According to various embodiments of the disclosure, the power control circuit 610 may confirm the magnitude of the current when a current flows in the port 517. The current sensed at the port 517 may be converted into data including the magnitude of the current by an ADC converter (not shown). The power control circuit 610 may transmit the data including the magnitude of the current to the processor 330 electrically connected thereto.

According to various embodiments of the disclosure, the processor 330 may determine that at least one of the areas in which the submergence recognition circuit 621, 623, and 625 are arranged has been submerged, in response to a confirmation of the magnitude of the current and confirmation that the magnitude of the current is equal to or greater than a specified value (or exceeds the specified value).

Figure 7:
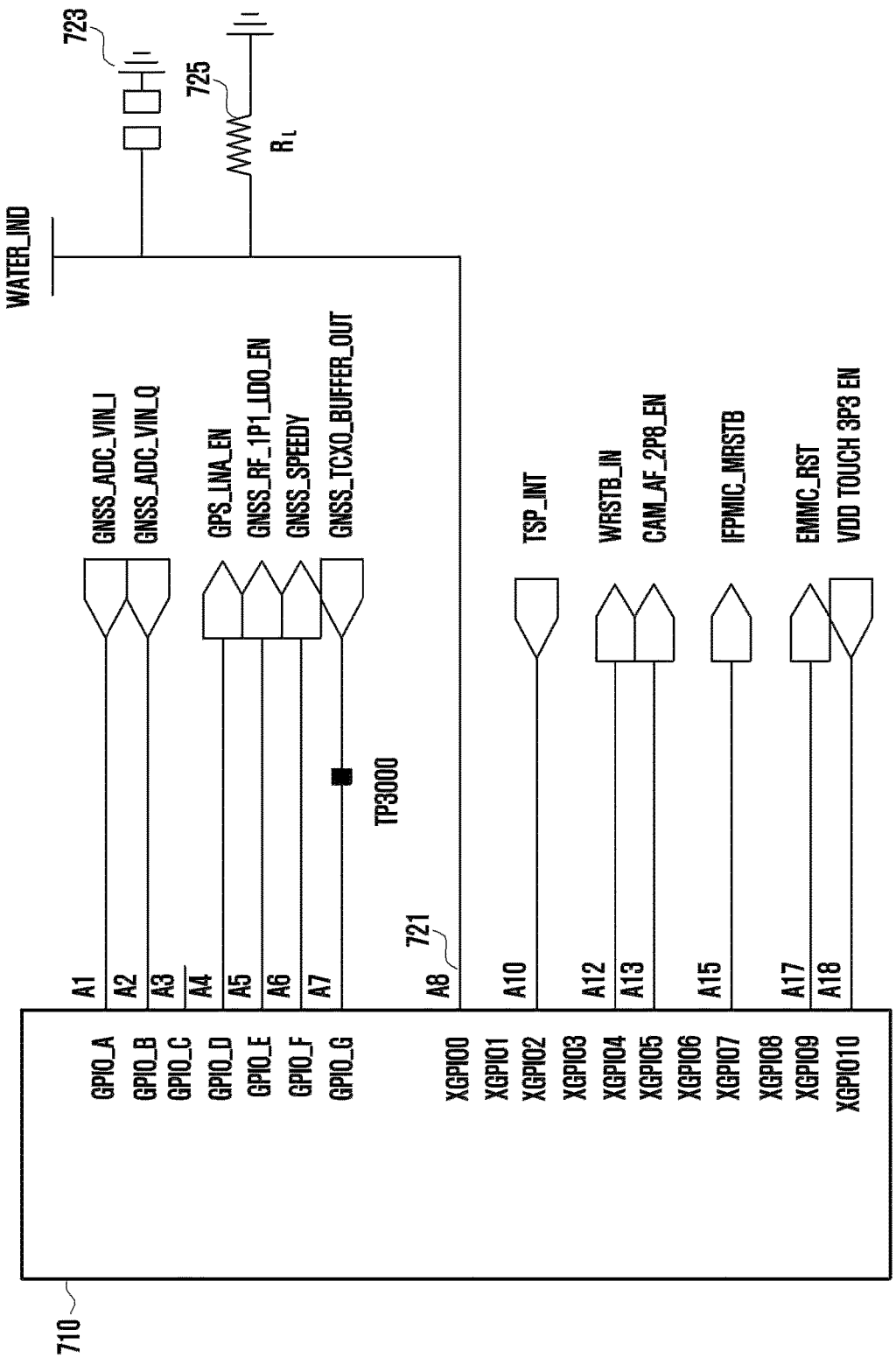

FIG. 7 illustrates an embodiment in which a submergence recognition circuit 723 and a resistor 725 connected in parallel to each other are connected to at least one port 721 included in a power control circuit 710 according to various embodiments of the disclosure.

According to various embodiments of the disclosure, the electronic device 300 may include the separate resistor 725 connected in parallel to the submergence recognition circuit 723 while being connected to the at least one port connected to the submergence recognition circuit 723.

According to various embodiments of the disclosure, the submergence recognition circuit 723 may be in a state in which the submergence recognition circuit 723 is not exposed to a conductive liquid and thus a first pole and a second pole thereof are not electrically connected to each other (open state). When the power control circuit 710 supplies power to the port 721, a current may flow in a portion connected to the resistor 725.

The submergence recognition circuit 723 may be in a state in which the submergence recognition circuit 723 is exposed to the conductive liquid and thus the first pole and the second pole thereof may be electrically connected to each other (short state). When the power control circuit 710 supplies power to the port 721, the intensity of the current sensed at the port 721 may increase.

According to various embodiments of the disclosure, the power control circuit 710 may transmit data related to the intensity of the current sensed at the port 721 to the processor 330. The processor 330 may determine that a portion in which the submergence recognition circuit 723 is disposed has been submerged, in response to the intensity of the current exceeding a specified value.

In the embodiments described above with reference to FIGS. 5 to 7, a plurality of submergence recognition circuits are connected to one port included in the power control circuit 520. In the case in which a plurality of submergence recognition circuits are connected to one port, even if only one of the submergence recognition circuits has the first pole and the second pole electrically connected to each other, a current flowing in the one port may be sensed. The submergence recognition circuit that has been submerged may not be confirmed, among the plurality of submersion recognition circuits. Hereinafter, a description will be made on embodiments in which the submergence recognition circuit that has been submerged can be confirmed, with reference to FIGS. 8 to 9.

Figure 8:
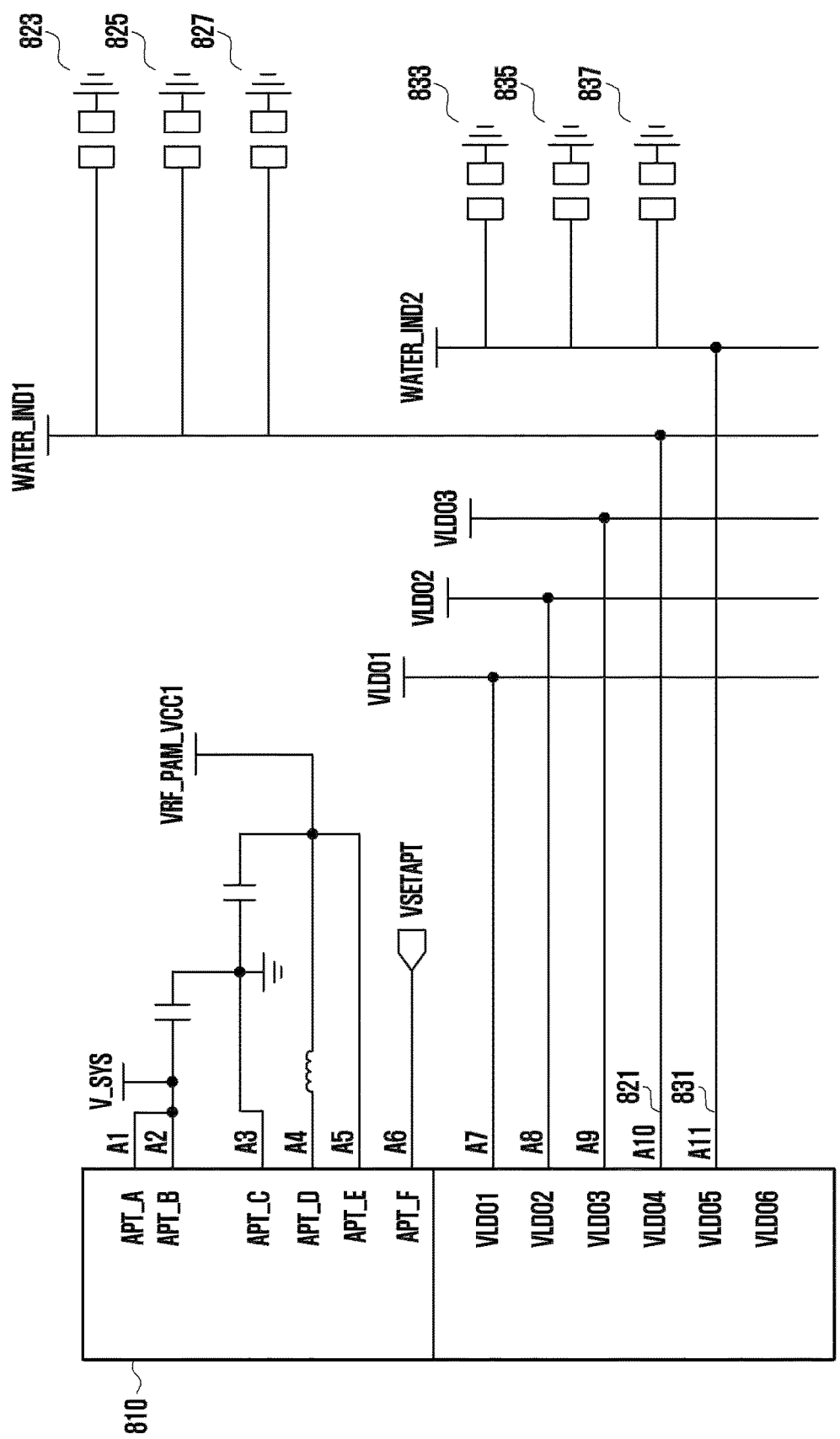

Referring to FIG. 8, a power control circuit 810 of an electronic device and a plurality of submergence recognition circuits 823, 825, 827, 833, 835, and 837 thereof connected to at least two ports 821 and 831 of the power control circuit 810, according to various embodiments of the disclosure, are illustrated.

According to various embodiments of the disclosure, at least one submergence recognition circuit (e.g., 823) of the plurality of submergence recognition circuits 823, 825, 827, 833, 835, and 837 may be exposed to a conductive liquid. A first pole and a second pole included in the submergence recognition circuit 823 may be electrically connected to each other by the conductive liquid.

According to various embodiments of the disclosure, a processor (e.g., the processor 330 of FIG. 3) may control the power control circuit 810 such that power is supplied to the port 821 connected to the submergence recognition circuits 823, 825, and 827. The power control circuit 810 may supply power to the port 821 connected to the submergence recognition circuits 823, 825, and 827, based on the control of the processor 330.

Under the assumption that at least one submergence recognition circuit (e.g., 823) of the plurality of submergence recognition circuits 823, 825, and 827 is exposed to a conductive liquid and thus a first pole and a second pole of the submergence recognition circuit 820 are electrically connected to each other, a current may flow in the submergence recognition circuit 823 in response to the power supplied by the power control circuit 810 to the port 821. The power control circuit 821 may sense the current flowing in the port 821 and may transmit, to the processor 330, data indicating that the current flows in the port 821. Furthermore, the power control circuit 810 may sense no current flowing in the port 823 and may transmit, to the processor 330, data indicating that no current flows in the port 821. Accordingly, the processor 330 may determine one or more submergence recognition circuits that have been submerged, among the submergence recognition circuits 823, 825, and 827 which are connected to the port 821.

In comparison between the embodiments described with reference to FIGS. 5 to 7 and the embodiment described with reference to FIG. 8, a submerged portion can be confirmed more precisely identified in the embodiments of FIG. 8 in which a submergence recognition circuit is disposed at each of a plurality of ports included in the power control circuit 810, than in the embodiments described with reference to FIGS. 5 to 7, in which one port is used.

Figure 9:
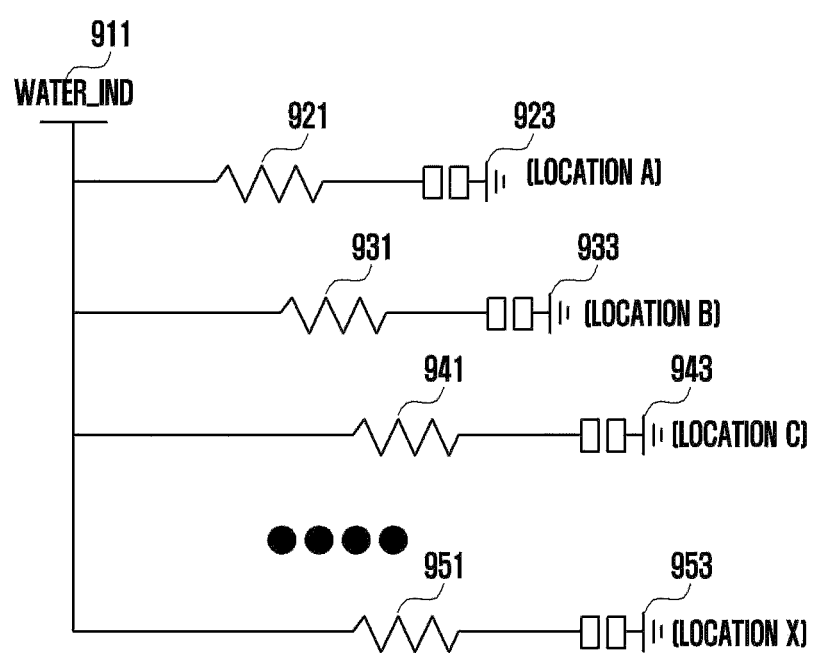

FIG. 9 illustrates an embodiment of arrangement of a plurality of submergence recognition circuits connected to one port of a power control circuit in an electronic device according to various embodiments of the disclosure.

Referring to FIG. 9, a plurality of submergence recognition circuits 923, 933, 943, and 953 may be connected in parallel to at least one port 911 of a power control circuit (e.g., the power control circuit 320 of FIG. 3).

According to various embodiments of the disclosure, the plurality of submergence recognition circuits 923, 933, 943, and 953 may be connected in series to the resistors 921, 931, 941, and 951, respectively.

According to various embodiments of the disclosure, the plurality of resistors 921, 931, 941, and 951 may have different resistance values. This is because, if the plurality of resistors 921, 931, 941, and 951 have different resistance values, when each of the plurality of submergence recognition circuits 923, 933, 943, and 953 is exposed to a conductive liquid and thus is in a short-circuited state, electric current flowing therethrough has different intensities according to magnitudes of the resistors 921, 931, 941, and 951. The power control circuit 310 may supply power to a port to which the plurality of submersion recognition circuits 923, 933, 943, and 953 are connected and may transmit the magnitude of the measured current to the processor 330. The processor 330 may determine the submergence recognition circuit that has been submerged, among the plurality of submergence recognition circuits 923, 933, 943, and 953, based on the magnitude of the measured current. Furthermore, the processor 330 may determine that an area in which the submerged submergence recognition circuit is disposed has been submerged.

In comparison between the embodiments described with reference to FIGS. 5 to 7 and the embodiment described with reference to FIG. 9, submergence recognition circuits are connected in series to resistors having different resistance values in the embodiment of FIG. 9, to enable measured currents to have different magnitudes, thereby making it possible to determine which submergence recognition circuit has been submerged. Therefore, a submerged portion can be more precisely identified in the embodiment described with reference to FIG. 9 than in the embodiments described with reference to FIGS. 5 to 7.

FIGS. 10A, 10B, 10C, 11A, 11B, and 12 illustrate embodiments of a submergence recognition circuit disposed in an electronic device according to various embodiments of the disclosure.

Figure 10A:
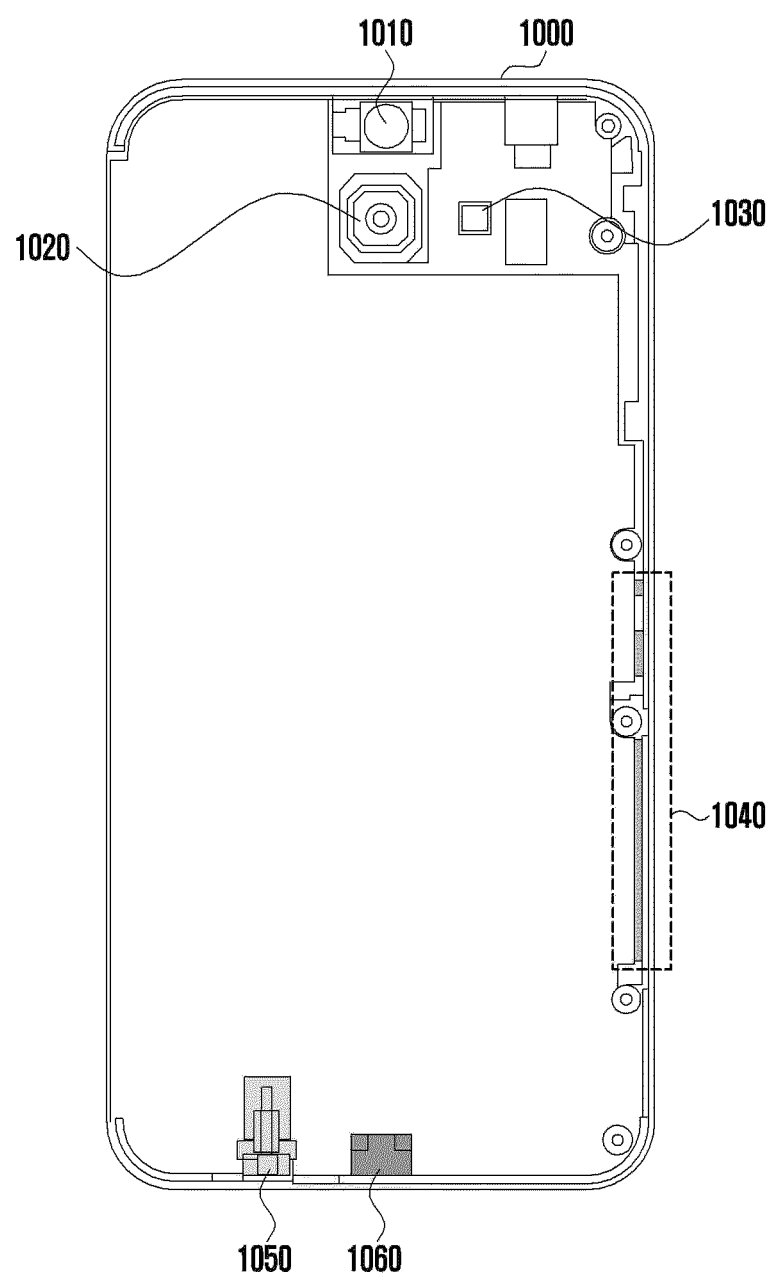
FIGS. 10A, 10B, 10C, 11A, 11B, and 12 illustrate embodiments of a submergence recognition circuit disposed in an electronic device according to various embodiments of the disclosure.

Referring to FIG. 10A, an electronic device according to various embodiments of the disclosure may include a circuit board 1010 on which a component inside the electronic device may be mounted. The circuit board 1010 may be implemented as a printed circuit board, a flexible printed circuit board, or the like.

According to various embodiments of the disclosure, an electronic device 1000 (e.g., the electronic device 300 of FIG. 3) may be waterproofed to prevent a conductive liquid from entering into the electronic device 300. In the case of the electronic device 300 which is not waterproofed, a conductive liquid may enter into the electronic device 300. A conductive liquid may enter through various portions from which the electronic device 300 may be exposed to the outside. For example, a conductive liquid may enter into the electronic device 300 through a space 1010 between a speaker and a housing, a space 1020 between a camera flash and the housing, a space 1030 between a camera and the housing, a space 1040 into which a subscriber identification module (SIM) or an SD card can be inserted, a space between various buttons (a power button, a volume-up button, a volume-down button, a multi-purpose button (which may refer to various buttons, such as an execution button of a voice recognition application)) and the housing, a location close to a connector 1060 (an earphone connector 1050 and a USB connector 1060) connectable to an external device using various schemes (e.g., USB), and the like.

According to various embodiments of the disclosure, at least one submergence recognition circuit may be disposed at various portions from which the electronic device 300 may be exposed to the outside.

Figure 10B:
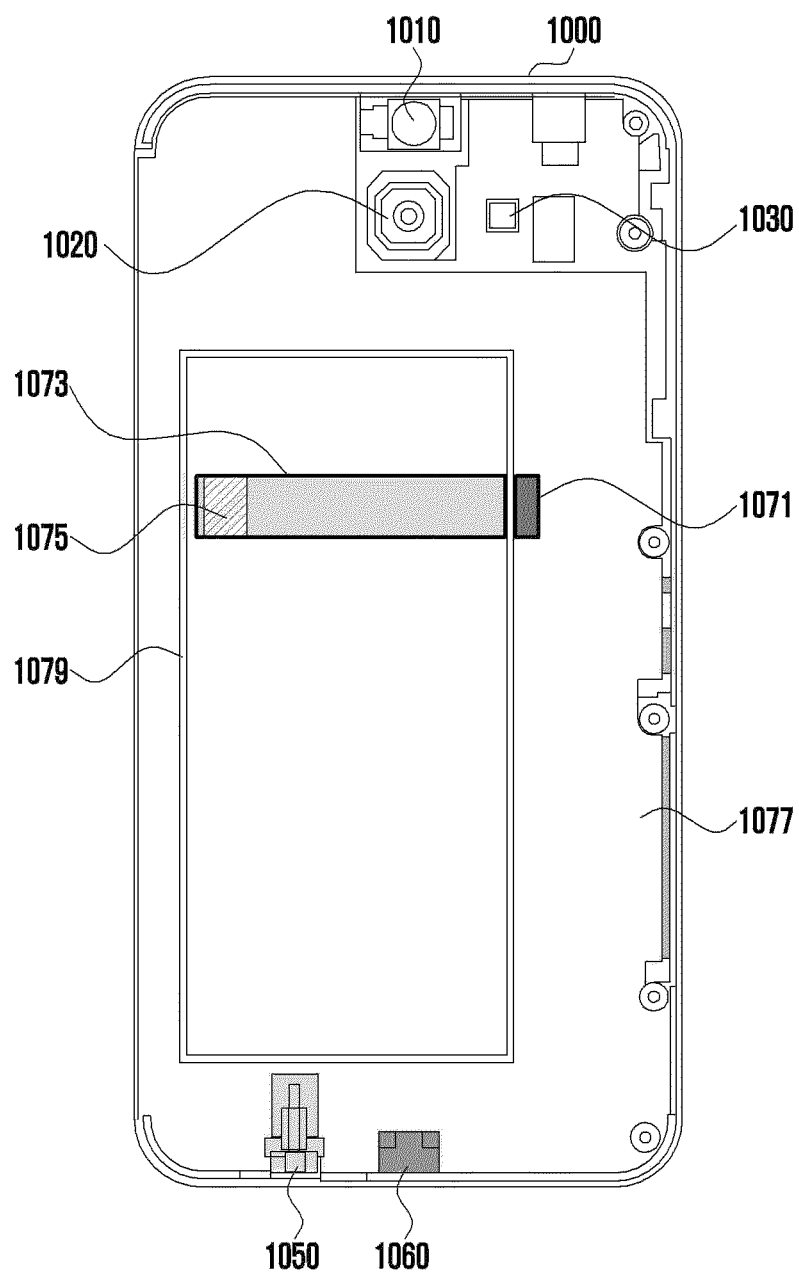
Figure 10C:
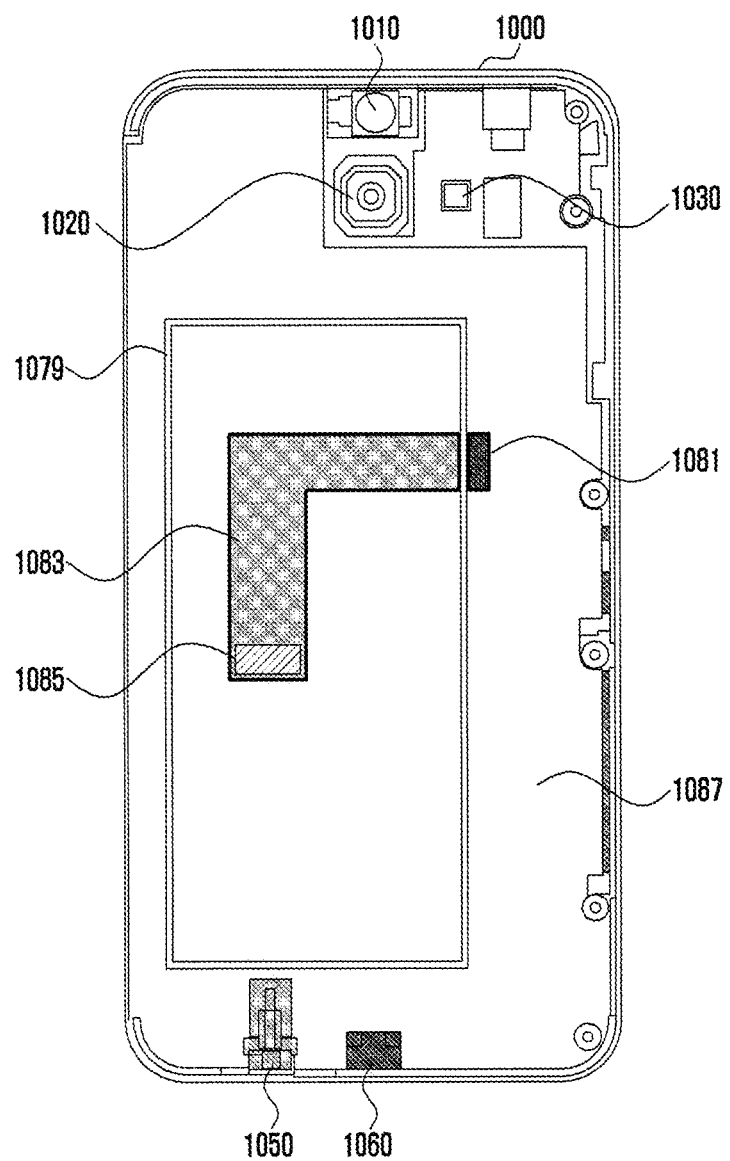

FIGS. 10B and 10C illustrate an embodiment in which a submergence recognition circuit is disposed in an electronic device according to various embodiments of the disclosure.

Referring to FIGS. 10B and 10C, a submergence recognition circuit 1075 or 1085 is not disposed on a PCB 1077 or 1087 in which various components of the electronic device 1000 are disposed, but is disposed on a separate flexible printed circuit board 1073 or 1083 (FPCB). The FPCB 1073 or 1083 is disposed between and connects at least one point 1071 or 1081 of the PCB 1077 or 1087 and a location at which the PCB 1077 or 1087 is not mounted (e.g., a partial area on a battery 1079). The submergence recognition circuit 1075 or 1085 may be disposed at a location into which a conductive liquid is easily introduced, using the separate FPCB 1073 or 1083. The structural constraints of the PCB 1073 or 1083 may be overcome by arranging the submergence recognition circuit 1075 or 1085 using the separate FPCB 1073 or 1083.

According to various embodiments of the disclosure, a submergence recognition circuit may be applied to various electronic devices (wearable devices, drones, computers, laptops, etc.) as well as smart phones.

Figure 11A:
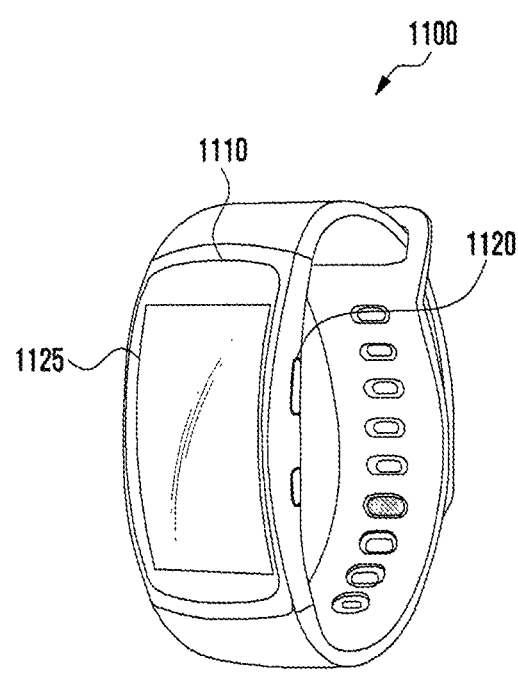
Figure 11B:
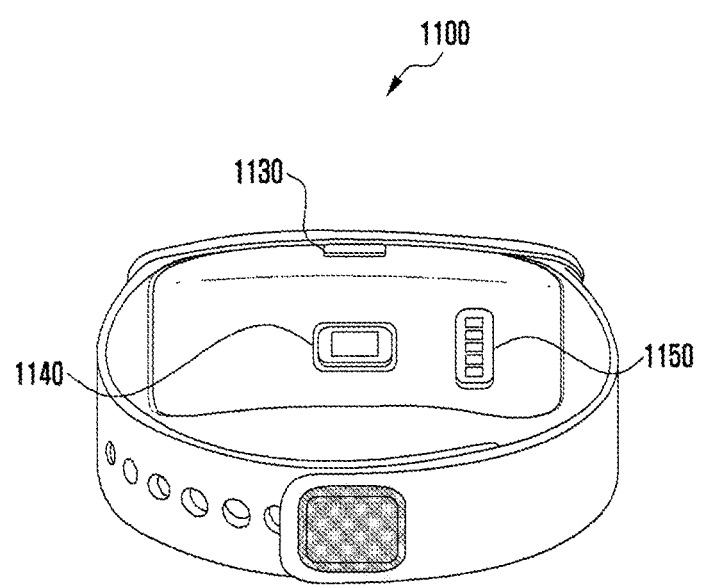

FIGS. 11A and 11B illustrate an embodiment in which a submergence recognition circuit is applied to a wearable device according to various embodiments of the disclosure.

In the case of a wearable device, the wearable device, which is a device worn on a body of a user on ordinary days, may be easily exposed to a conductive liquid.

Referring to FIGS. 11A to 11B, the submergence recognition circuit according to various embodiments of the disclosure may be disposed in an area from which a wearable device 1100 is easily exposed to a conductive liquid. For example, the submergence recognition circuit may be disposed in an area easily exposed to a conductive liquid, such as a space 1110 that may be formed between a display 1125 and a housing of the wearable device 1100, a space 1120 or 1130 that may be formed between a button and the housing, a space 1140 that may be formed between an external sensor (e.g., a heart rate sensor) and the housing, and a space 1150 that may be formed between the housing and a connector connectable to the external device.

Figure 12:
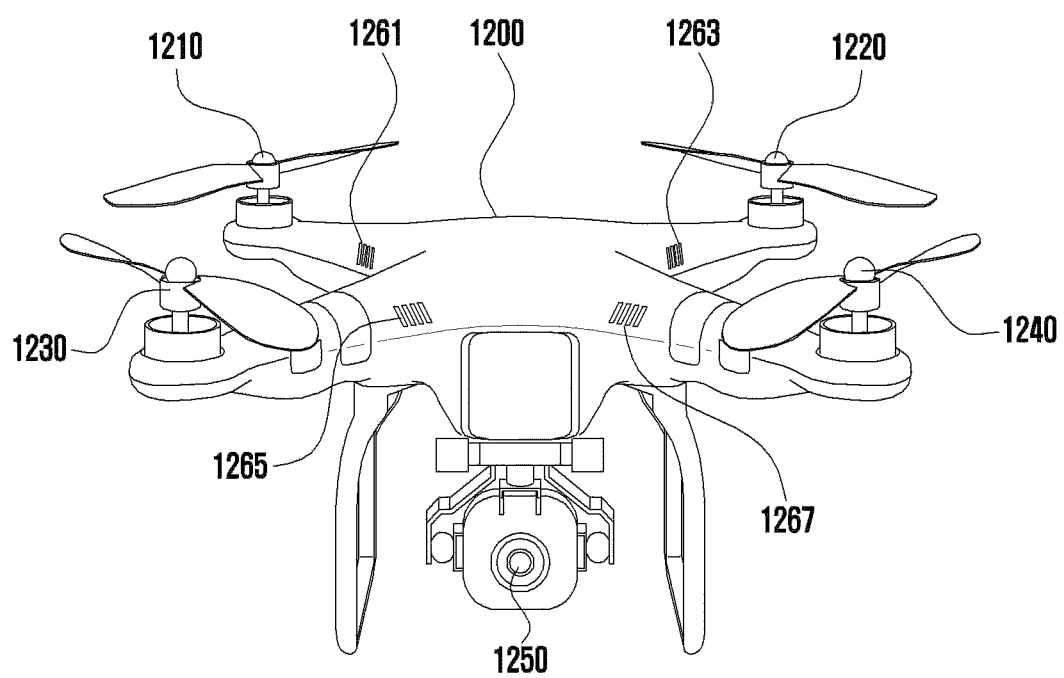

FIG. 12 illustrates an embodiment in which a submergence recognition circuit is disposed in a drone 1200 according to various embodiments of the disclosure.

The drone 1200 may refer to a pilotless aircraft that can be controlled by radio waves. The drone 1200 is mainly located in the air during operation, and thus is easily exposed to a conductive liquid, such as humidity, rain, or snow.

Referring to FIG. 12, a submergence recognition circuit according to various embodiments of the disclosure may be disposed in an area from which the drone 1200 is easily exposed to a conductive liquid. For example, the submergence recognition circuit may be disposed in an area easily exposed to a conductive liquid, such as areas 1210, 1220, 1230, and 1240 adjacent to a motor connected to a propeller of the drone 1200, gaps 1261, 1263, 1265, and 1267 for dissipating heat inside the drone 1200, and various sensors included in the drone 1200 (e.g., an image sensor 1250, etc.).

An electronic device according to various embodiments of the disclosure includes: a power control circuit configured to control power supplied to at least one component of the electronic device; at least one submergence recognition circuit including a first pole connected to at least one port of the power control circuit and a second pole connected to a ground; a processor electrically connected to the power control circuit; and a memory electrically connected to the processor, wherein the memory may be configured, when executed, to store instructions for allowing the processor to: control the power control circuit such that power is supplied to the submergence recognition circuit; sense a current flowing from the submergence recognition circuit to the power control circuit; and determine whether an area in which the submergence recognition circuit is disposed has been submerged, based on the sensing result of the current.

In the electronic device according to various embodiments of the disclosure, the first pole and the second pole of the at least one submergence recognition circuit may be electrically connected to each other in the case that the at least one submergence recognition circuit is exposed to the conductive liquid.

In the electronic device according to various embodiments of the disclosure, the memory may be configured, when executed, to store instructions for allowing the processor to: confirm the magnitude of the current of the electrical signal; and determine that an area in which the submergence recognition circuit is disposed has been submerged, in response to a confirmation that the magnitude of the current of the electrical signal is greater than or equal to a configured value.

An electronic device according to various embodiments of the disclosure includes a resistor which is connected to at least one port of the power control circuit connected to the first pole and is connected in parallel to the submergence recognition circuit, wherein the memory may be configured, when executed, to store instructions for allowing the processor to: control the power control circuit such that power is supplied to the at least one port of the power control circuit; confirm an electrical signal transmitted to the at least one port of the power control circuit; and determine whether an area in which the submergence recognition circuit is disposed has been submerged, based on whether the current intensity of the electrical signal exceeds a configured value.

In the electronic device according to various embodiments of the disclosure, the at least one submergence recognition circuit includes a plurality of submergence recognition circuits, each of which is connected to a ground and the other port of the power control circuit, and the memory may be configured, when executed, to store an instruction for allowing the processor to: confirm whether an electrical signal is transmitted to the power control circuit from each of the plurality of submergence recognition circuits; confirm the submergence recognition circuit that supplies the electrical signal to the power control circuit; and confirm a location of the submerged area, based on the location of the submergence recognition circuit that supplies the electrical signal.

In the electronic device according to various embodiments of the disclosure, the at least one submergence recognition circuit includes a plurality of submergence recognition circuits, which are connected to a ground and at least one port of the power control circuit, are connected in series to the at least one port of the power control circuit, and have different resistance values, and the memory may be configured, when executed, to store an instruction for allowing the processor to: confirm whether an electrical signal is transmitted to the power control circuit from each of the plurality of submergence recognition circuits; confirm the submergence recognition circuit that supplies the electrical signal to the power control circuit, based on the current intensity of the electrical signal; and confirm a location of the submerged area, based on the location of the submergence recognition circuit that supplies the electrical signal.

In the electronic device according to various embodiments of the disclosure, the power control circuit may be configured to confirm whether an electrical signal is transmitted from the submergence recognition circuit to the power control circuit, and transmit, to the processor, information of a port to which the electrical signal is transmitted.

In the electronic device according to various embodiments of the disclosure, the at least one submergence recognition circuit may be disposed in an area of a printed circuit board on which the power control circuit and the processor are disposed.

In the electronic device according to various embodiments of the disclosure, the memory may be configured, when executed, to store an instruction for allowing the processor to display a screen indicating that the submergence recognition circuit has been submerged, in response to a determination that the area in which the submergence recognition circuit is disposed has been submerged.

In the electronic device according to various embodiments of the disclosure, the memory may be configured, when executed, to store an instruction for allowing the processor to control the power control circuit such that power supplied to a component disposed near the area in which the submergence recognition circuit is disposed is cut off, in response to a determination that the area in which the submergence recognition circuit is disposed has been submerged.

In the electronic device according to various embodiments of the disclosure, the memory may be configured, when executed, to store an instruction for allowing the processor to transmit, to an external electronic device, data indicating that the area in which the submergence recognition circuit is disposed has been submerged, in response to a determination that the area in which the submergence recognition circuit is disposed has been submerged.

An electronic device according to various embodiments of the disclosure includes: a first PCB on which the power control circuit, the processor, and the memory are disposed; and a second PCB on which the submergence recognition circuit is disposed, wherein the second PCB may be electrically connected to a portion of the first PCB.

Figure 13:
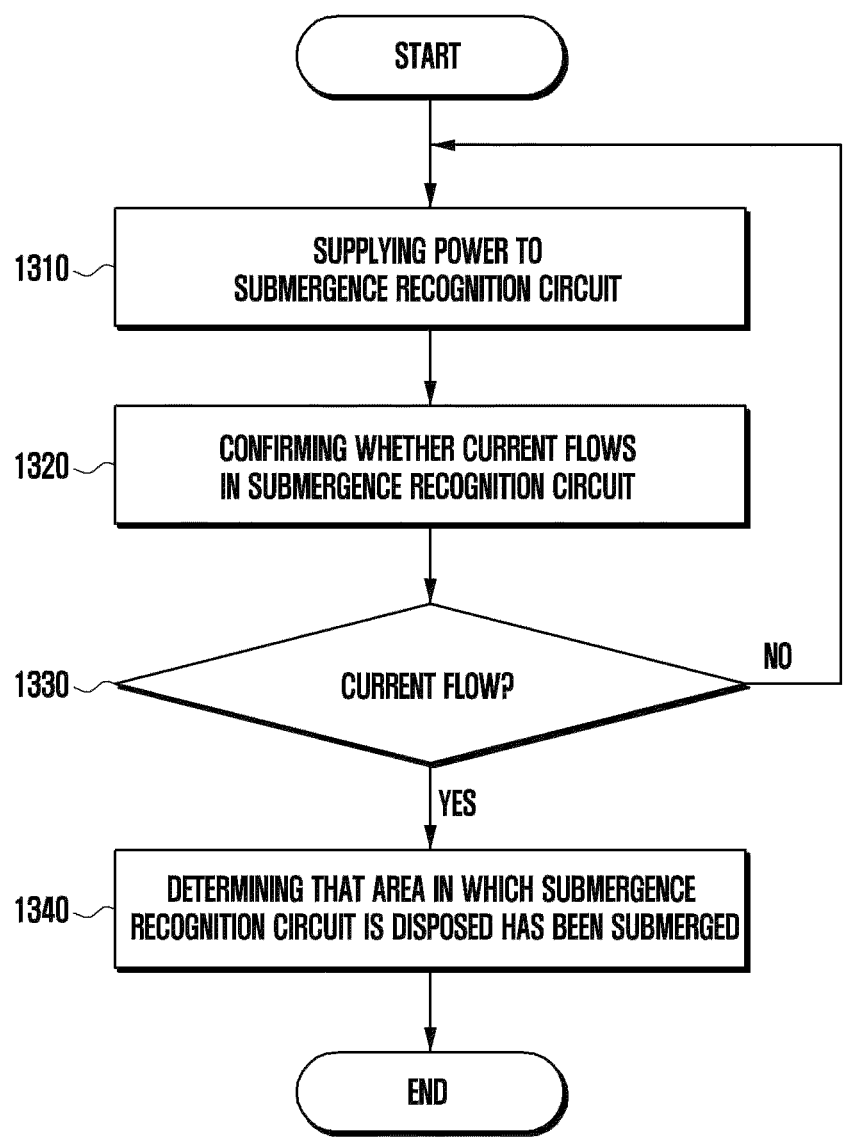
FIG. 13 is a flowchart of a method for operating an electronic device according to various embodiments of the disclosure.

FIG. 13 is a flowchart illustrating a method for operating an electronic device according to various embodiments of the disclosure.

Referring to FIG. 13, the processor 330 may control the power control circuit 320 such that power is supplied to the submergence recognition circuit 310 (operation 1310).

The processor 330 may confirm whether a current flows in the submergence recognition circuit 310 (operation 1320). According to various embodiments of the disclosure, when the submergence recognition circuit 310 is exposed to a conductive liquid, the first pole (a pole connected to the power control circuit 320) and the second pole (a pole connected to a ground) which are included in the submergence recognition circuit 310 may be electrically connected to each other. That is, when the submergence recognition circuit 310 is exposed to a conductive liquid, a current may flow in the submergence recognition circuit 310 by the power supplied from the power control circuit 320.

When no current flows in the submergence recognition circuit 310, the processor 330 may determine that the submergence recognition circuit 310 is not exposed to a conductive liquid (operation 1330).

When a current flows in the submergence recognizing circuit 310, the processor 330 may determine that the submergence recognizing circuit 310 has been exposed to a conductive liquid and an area in which the submergence recognizing circuit is disposed has been submerged (operation 1340).

A method for operating an electronic device according to various embodiments of the disclosure may include: controlling, by a processor, a power control circuit such that power is supplied to a submergence recognition circuit including a second pole connected to a ground and a first pole connected to at least one port of the power control circuit configured to control power supplied to at least one component of the electronic device; confirming, by the processor, whether an electrical signal is transmitted from the submergence recognition circuit to the power control circuit; and determining whether an area in which the submergence recognition circuit is disposed has been submerged, based on whether the electrical signal is transmitted.

In the method for operating an electronic device according to various embodiments of the disclosure, in the case that the submergence recognition circuit is exposed to a conductive liquid, the first pole and the second pole of the submergence recognition circuit may be electrically connected to each other.

A method for operating an electronic device according to various embodiments of the disclosure may further include: confirming the magnitude of a current of the electrical signal; and determining that the area in which the submergence recognition circuit is disposed has been submerged, in response to a confirmation that the magnitude of the current of the electrical signal is greater than or equal to a configured value.

In the method for operating an electronic device according to various embodiments of the disclosure, the electronic device may be connected to at least one port of the power control circuit connected to the first pole and include a resistor connected in parallel to the submergence recognition circuit. The method for operating the electronic device may include: controlling the power control circuit such that power is supplied to the at least one port of the power control circuit; confirming an electrical signal transmitted to the at least one port of the power control circuit; and determining whether an area in which the submergence recognition circuit is disposed has been submerged, based on whether the current intensity of the electrical signal exceeds a configured value.

In the method for operating an electronic device according to various embodiments of the disclosure, the electronic device includes a plurality of submergence recognition circuits, each of which is connected to a ground and the other port of the power control circuit, and the method for operating the electronic device may include: confirming whether an electrical signal is transmitted to the power control circuit from each of the plurality of submergence recognition circuits; confirming the submergence recognition circuit that supplies the electrical signal to the power control circuit; and confirming a location of the submerged area, based on a location of the submergence recognition circuit that supplies the electrical signal.

In the method for operating an electronic device according to various embodiments of the disclosure, the electronic device includes a plurality of submergence recognition circuits, which are connected to a ground and at least one port of the power control circuit, are connected in series to the at least one port of the power control circuit, and have different resistance values, and the method for operating the electronic device may include: confirming whether an electrical signal is transmitted to the power control circuit from each of the plurality of submergence recognition circuits; confirming the submergence recognition circuit that supplies the electrical signal to the power control circuit, based on the current intensity of the electrical signal; and confirming a location of the submerged area, based on a location of the submergence recognition circuit that supplies the electrical signal.

The method for operating an electronic device according to various embodiments of the disclosure may include: displaying a screen indicating that the submergence recognition circuit has been submerged, in response to a determination that the area in which the submergence recognition circuit is disposed has been submerged.

The method for operating an electronic device according to various embodiments of the disclosure may include controlling the power control circuit such that power supplied to a component disposed near the area in which the submergence recognition circuit is disposed is cut off, in response to a determination that the area in which the submergence recognition circuit is disposed has been submerged.

The method for operating an electronic device according to an embodiment of the disclosure may include transmitting, to an external electronic device, data indicating that the area in which the submergence recognition circuit is disposed has been submerged, in response to a determination that an area in which the submergence recognition circuit is disposed has been submerged.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
    a power control circuit configured to control power supplied to at least one component of the electronic device;
    at least one submergence recognition circuit comprising a first pole connected to at least one port of the power control circuit and a second pole connected to a ground,
    wherein the at least one submergence recognition circuit comprises a plurality of submergence recognition circuits, which are connected between the ground and the at least one port of the power control circuit and connected in series to the at least one port of the power control circuit and have different resistance values;
    a processor electrically connected to the power control circuit; and
    a memory electrically connected to the processor,
    wherein the memory is adapted, when executed, to store instructions for allowing the processor to:
    control the power control circuit such that power is supplied to the plurality of submergence recognition circuits;
    sense a current flowing from one of the plurality of submergence recognition circuits to the power control circuit;
    identify a submergence recognition circuit that supplies an electrical signal to the power control circuit, based on a current intensity of the electrical signal; and
    determine a location of a submerged area, based on a location of the submergence recognition circuit that supplies the electrical signal.

2. The electronic device of claim 1, wherein the first pole and the second pole of the at least one submergence recognition circuit are electrically connected to each other in case that the at least one submergence recognition circuit is exposed to a conductive liquid.

3. The electronic device of claim 1, wherein the memory is adapted, when executed, to store instructions for allowing the processor to:
    identify a current magnitude of an electrical signal; and
    determine that an area in which the submergence recognition circuit is disposed has been submerged, in response to a confirmation that the current magnitude of the electrical signal is greater than or equal to a configured value.

4. The electronic device of claim 1, further comprising:
    a resistor that is connected to at least one port of the power control circuit connected to the first pole and is connected in parallel to the submergence recognition circuit,
    wherein the memory is adapted, when executed, to store instructions for allowing the processor to:
    control the power control circuit such that power is supplied to at least one port of the power control circuit;
    identify an electrical signal transmitted to the at least one port of the power control circuit; and
    determine whether an area in which the submergence recognition circuit is disposed has been submerged, based on whether a current intensity of the electrical signal exceeds a configured value.

5. The electronic device of claim 1,
    wherein the memory is adapted, when executed, to store an instruction for allowing the processor to:
    identify whether an electrical signal is transmitted to the power control circuit from each submergence recognition circuit of the plurality of submergence recognition circuits;
    confirm a submergence recognition circuit that supplies the electrical signal to the power control circuit; and
    confirm a location of a submerged area, based on the location of the submergence recognition circuit that supplies the electrical signal.

6. The electronic device of claim 1, wherein the power control circuit is adapted to:

identify whether an electrical signal is transmitted from the submergence recognition circuit to the power control circuit; and transmit, to the processor, information of a port to which the electrical signal is transmitted.

7. The electronic device of claim 1, wherein the at least one submergence recognition circuit is disposed in an area of a printed circuit board on which the power control circuit and the processor are arranged.

8. The electronic device of claim 1, wherein the memory is adapted, when executed, to store an instruction for allowing the processor to display a screen indicating that the submergence recognition circuit has been submerged, in response to a determination that an area in which the submergence recognition circuit is disposed has been submerged.

9. The electronic device of claim 1, wherein the memory is adapted, when executed, to store an instruction for allowing the processor to control the power control circuit such that power supplied to a component disposed near an area in which the submergence recognition circuit is disposed is cut off, in response to a determination that the area in which the submergence recognition circuit is disposed has been submerged.

10. The electronic device of claim 1, wherein the memory is adapted, when executed, to store an instruction for allowing the processor to transmit, to an external electronic device, data indicating that an area in which the submergence recognition circuit is disposed has been submerged, in response to a determination that the area in which the submergence recognition circuit is disposed has been submerged.

11. The electronic device of claim 1, further comprising:
a first printed circuit board (PCB) on which the power control circuit, the processor, and the memory are arranged; and
a second PCB on which the submergence recognition circuit is arranged,
wherein the second PCB is electrically connected to a portion of the first PCB.

12. A method for operating an electronic device, the method comprising:
controlling, by a processor, a power control circuit such that power is supplied to at least one submergence recognition circuit comprising a second pole connected to a ground and a first pole connected to at least one port of the power control circuit configured to control power supplied to at least one component of the electronic device, wherein the at least one submergence recognition circuit comprises a plurality of submergence recognition circuits, which are connected between the ground and the at least one port of the power control circuit and connected in series to the at least one port of the power control circuit and have different resistance values;
identifying, by the processor, whether an electrical signal is transmitted from one of the plurality of submergence recognition circuits to the power control circuit;
identifying a submergence recognition circuit that supplies the electrical signal to the power control circuit, based on a current intensity of the electrical signal; and
determining a location of a submerged area, based on a location of the submergence recognition circuit that supplies the electrical signal.

13. The method of claim 12, wherein the first pole and the second pole of the submergence recognition circuit are electrically connected to each other in case that the submergence recognition circuit is exposed to a conductive liquid.

14. The method of claim 12, further comprising:
confirming a current magnitude of the electrical signal; and
determining that an area in which the submergence recognition circuit is disposed has been submerged, in response to a confirmation that the current magnitude of the electrical signal is greater than or equal to a configured value.

* * * * *